US008648463B2

(12) United States Patent
Thacker et al.

(10) Patent No.: US 8,648,463 B2
(45) Date of Patent: Feb. 11, 2014

(54) ASSEMBLY OF MULTI-CHIP MODULES WITH PROXIMITY CONNECTORS USING REFLOWABLE FEATURES

(75) Inventors: Hiren D. Thacker, San Diego, CA (US); Jing Shi, Carlsbad, CA (US); John E. Cunningham, San Diego, CA (US); Ashok V. Krishnamoorthy, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 190 days.

(21) Appl. No.: 12/781,732

(22) Filed: May 17, 2010

(65) Prior Publication Data

US 2011/0278718 A1 Nov. 17, 2011

(51) Int. Cl.
| | |
|---|---|
| *H01L 23/48* | (2006.01) |
| *H01L 23/52* | (2006.01) |
| *H01L 29/40* | (2006.01) |
| *H01L 23/02* | (2006.01) |
| *H01L 23/34* | (2006.01) |
| *H01L 21/00* | (2006.01) |

(52) U.S. Cl.
USPC ........... 257/737; 257/686; 257/723; 257/738; 257/739; 257/E21.506; 257/E23.068; 438/107; 438/109

(58) Field of Classification Search
USPC ....................................................... 257/739
See application file for complete search history.

(56) References Cited

U.S. PATENT DOCUMENTS

| | | | | |
|---|---|---|---|---|
| 6,507,104 B2 * | 1/2003 | Ho et al. | ........................ | 257/712 |
| 7,838,964 B2 * | 11/2010 | Carobolante et al. | ......... | 257/531 |
| 2003/0119299 A1 * | 6/2003 | Jiang et al. | .................... | 438/612 |
| 2004/0235221 A1 * | 11/2004 | Taguchi et al. | ............... | 438/108 |
| 2005/0259174 A1 * | 11/2005 | Nishio et al. | .................. | 348/340 |
| 2009/0085183 A1 * | 4/2009 | Mitchell et al. | ............... | 257/686 |

* cited by examiner

*Primary Examiner* — Michael Jung
(74) *Attorney, Agent, or Firm* — Park, Vaughan, Fleming & Dowler LLP; Steven E. Stupp

(57) ABSTRACT

A multi-chip module (MCM) that includes at least two substrates, having facing surfaces, which are mechanically coupled by a set of coupling elements having a reflow characteristic, is described. One of the two substrates includes another set of coupling elements having another reflow characteristic, which is different than the reflow characteristic. These different reflow characteristics of the sets of coupling elements allow different temperature profiles to be used when bonding the two substrates to each other than when bonding the one of the two substrates to a carrier. For example, the temperature profiles may have different peak temperatures and/or different durations from one another. These reflow characteristics may facilitate low-cost, high-yield assembly and alignment of the substrates in the MCM, and may allow temperature-sensitive components to be included in the MCM.

13 Claims, 10 Drawing Sheets

⌐ 300

MECHANICALLY COUPLE A FIRST SURFACE OF A FIRST SUBSTRATE IN AN
*MCM* TO ANOTHER COMPONENT BY REFLOWING A SET OF FIRST COUPLING
ELEMENTS BASED ON A FIRST REFLOW CHARACTERISTIC
310

MECHANICALLY COUPLE THE FIRST SURFACE OR A SECOND SURFACE OF
THE FIRST SUBSTRATE TO A THIRD SURFACE OF A SECOND SUBSTRATE IN
THE *MCM* BY REFLOWING A SET OF SECOND COUPLING ELEMENTS BASED
ON A SECOND REFLOW CHARACTERISTIC
312

FIG. 3

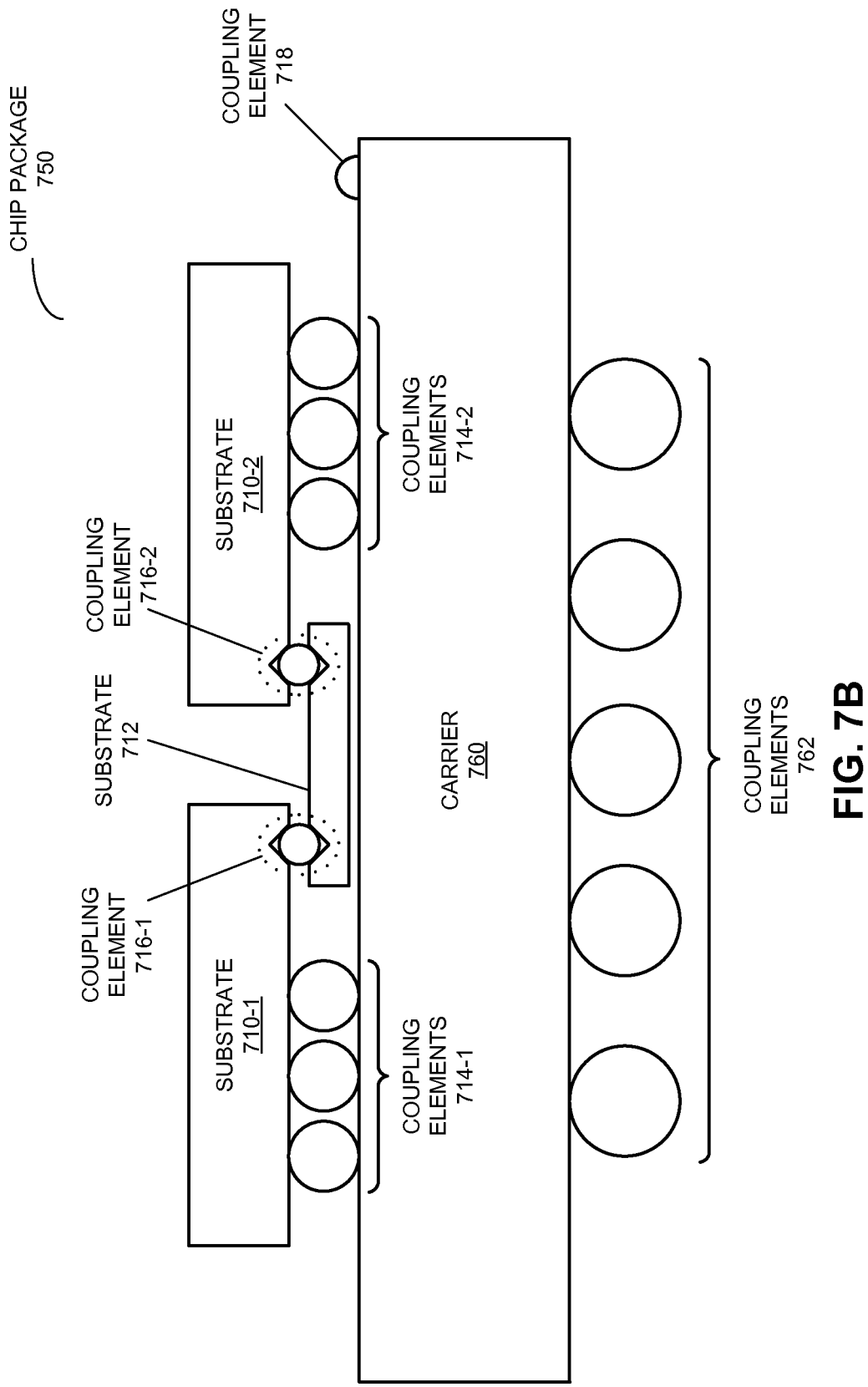

ASSEMBLY OF MULTI-CHIP MODULES WITH PROXIMITY CONNECTORS USING REFLOWABLE FEATURES

GOVERNMENT LICENSE RIGHTS

This invention was made with Government support under Agreement No. HR0011-08-9-0001 awarded by DARPA. The Government has certain rights in the invention.

BACKGROUND

1. Field

The present disclosure generally relates to multi-chip modules (MCMs) for semiconductor chips. More specifically, the present disclosure relates to an MCM that includes assembly features with different reflow characteristics that are reflowed during assembly of the MCM.

2. Related Art

As integrated-circuit (IC) technology continues to scale to smaller critical dimensions, it is increasingly difficult for existing interconnects to provide suitable communication characteristics, such as: high bandwidth, low power, reliability and low cost. Engineers and researchers are investigating chip stacking in multi-chip modules (MCMs) to address these problems, and to enable future high-density, high-performance systems.

However, it is difficult to bond chips to each other and to carriers (such as printed circuit boards) in chip stacks using existing assembly techniques because of stringent requirements for alignment accuracy and manufacturing throughput. For example, if chips are bonded to each other using a silicone-based adhesive, a pick-and-place tool and non-standard fixturing may be needed to obtain the desired alignment.

Alternatively or additionally, an MCM may be assembled using balls and pits, in which adjacent chips in the MCM are aligned by placing the balls into collocated pits on surfaces of the chips. While this existing assembly technique can provide high alignment accuracy among the chips in the MCM, it typically involves multiple assembly operations, which makes assembly of the MCM complicated, time-consuming and expensive.

Hence, what is needed is a technique for assembling an MCM without the above-described problems.

SUMMARY

One embodiment of the present disclosure provides a multi-chip module (MCM) that includes a first substrate having a first surface and a second surface on an opposite side of the first substrate from the first surface. A set of first coupling elements having a first reflow characteristic are disposed on the first surface. This set of first coupling elements may mechanically couple the first substrate to another component. Furthermore, the MCM includes a second substrate having a third surface that is mechanically coupled to one of the first surface and the second surface by a set of second coupling elements having a second reflow characteristic, where the first reflow characteristic is different than the second reflow characteristic.

Note that the first reflow characteristic includes a first temperature profile with a first peak temperature and a first duration that is used when reflowing at least a portion of the set of first coupling elements, and the second reflow characteristic includes a second temperature profile with a second peak temperature and a second duration that is used when reflowing at least a portion of the set of second coupling elements. Furthermore, the first peak temperature may be different from the second peak temperature, the first duration may be different from the second duration, or the first peak temperature and the second peak temperature may be different from the first duration and the second duration.

In some embodiments, the set of first coupling elements includes a set of first positive features that protrudes above the first surface, and the set of second coupling elements includes a set of second positive features that protrudes above the third surface, and one of the first surface and the second surface. A given positive feature in one of the set of first positive features and the set of second positive features may include a spherically shaped coupling component. Furthermore, the first reflow characteristic may be associated with the set of first positive features, and the second reflow characteristic may be associated with the set of second positive features.

Additionally, the set of first coupling elements may include a set of first negative features (such as etch pits) that are recessed below the first surface and that are mechanically coupled to corresponding first positive features. Note that the first reflow characteristic may be associated with: the set of first negative features; or the set of first positive features and the set of first negative features.

In some embodiments, the reflow characteristic of a given second positive feature in the set of second positive features varies as a function of an angular position on a surface of the given second positive feature. This angular variation of the reflow characteristic of the given second positive feature may facilitate modification of a spacing between the first substrate and the second substrate.

Additionally, the set of second coupling elements may include a set of first negative features (such as etch pits) that are recessed below one of the first surface and the second surface, and may include a set of second negative features (such as etch pits) that are recessed below the third surface. A given second positive feature in the set of second positive features may be, respectively, mechanically coupled to a pair of negative features that includes one of the first negative features and one of the second negative features. Note that the second reflow characteristic may be associated with: the set of first negative features and the set of second negative features; or the set of second positive features, the set of first negative features and the set of second negative features.

In some embodiments, the set of first coupling elements and the set of second coupling elements also provide electrical coupling.

In some embodiments, a set of first proximity connectors are disposed on one of the first surface and the second surface, and a set of second proximity connectors are disposed on the third surface. The set of second coupling elements may align the first proximity connectors and the second proximity connectors, and may assemble the MCM, thereby facilitating proximity communication between the first substrate and the second substrate.

Furthermore, the first reflow characteristic and the second reflow characteristic may facilitate selective disassembly of the MCM during rework.

Another embodiment provides a chip package that includes a substrate having a first surface, where a set of first coupling elements having the first reflow characteristic and a set of second coupling elements having the second reflow characteristic, which is different than the first reflow characteristic, are disposed on the first surface. Note that the set of first coupling elements may mechanically couple the substrate to another component. In addition, the chip package includes a flexible connector having a second surface that is mechanically coupled to the first surface by the set of second coupling elements.

Note that the flexible connector may be incompatible with the first peak temperature, and the second peak temperature, which is less than the first peak temperature, may therefore facilitate assembly of the chip package.

Another embodiment provides an electronic device that includes the MCM and/or the chip package.

Another embodiment provides a method for assembling an MCM. During this method, the first surface of the first substrate in the MCM is mechanically coupled to another component by reflowing the set of first coupling elements disposed on the first surface based on the first reflow characteristic of the first coupling elements. Then, one of the first surface and the second surface of the first substrate is mechanically coupled to the third surface of the second substrate in the MCM by reflowing the set of second coupling elements in the MCM based on the second reflow characteristic of the set of second coupling elements, where the first reflow characteristic is different than the second reflow characteristic.

BRIEF DESCRIPTION OF THE FIGURES

FIG. 3 is a flow chart illustrating a process for assembling an MCM in accordance with an embodiment of the present disclosure.

FIG. 7B is a block diagram illustrating a chip package in accordance with an embodiment of the present disclosure.

Note that like reference numerals refer to corresponding parts throughout the drawings. Moreover, multiple instances of the same part are designated by a common prefix separated from an instance number by a dash.

DETAILED DESCRIPTION

Embodiments of a multi-chip module (MCM), a package, an electronic device that includes the MCM or the package, and a technique for assembling the MCM are described. This MCM includes at least two substrates, having facing surfaces, which are mechanically coupled by a set of coupling elements having a reflow characteristic. In addition, one of the two substrates includes another set of coupling elements having another reflow characteristic, which is different than the reflow characteristic. These different reflow characteristics of the sets of coupling elements allow different temperature profiles to be used when bonding the two substrates to each other than when bonding the one of the two substrates to a carrier. For example, the temperature profiles may have different peak temperatures and/or different durations from one another.

These reflow characteristics may facilitate the integration of multiple chips in the MCM. In particular, relative to existing assembly techniques, the assembly technique may: decrease the complexity of the MCM, increase the alignment accuracy, increase the manufacturing throughput, and/or lower the assembly cost. For example, the assembly technique may facilitate simultaneous alignment and assembly of large numbers of chips (such as two or more chips) in an MCM. In addition, the assembly technique may allow staggered reflowing of the sets of coupling elements during assembly of the MCM, which may allow temperature-sensitive components to be included in the MCM.

Figure 1A:
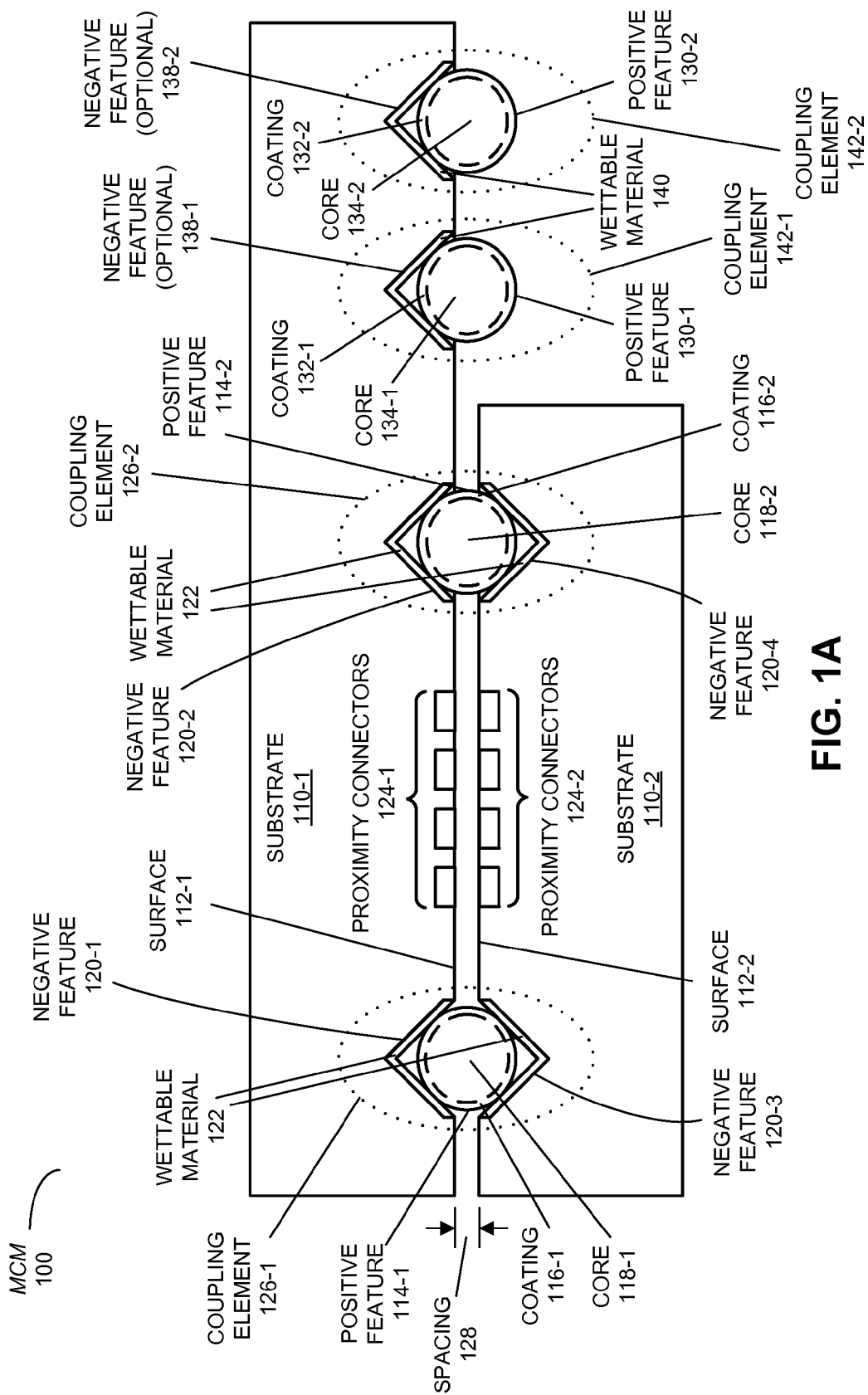
FIG. 1A is a block diagram illustrating a multi-chip module (MCM) in accordance with an embodiment of the present disclosure.

We now describe embodiments of an MCM. FIG. 1A presents a block diagram illustrating an MCM 100. This MCM uses positive features 114 and negative features 120 (such as ball-and-etch-pit structures) to precisely align substrates 110 (which may include silicon, plastic, glass or a ceramic material), thereby facilitating alignment-sensitive communication (such as proximity communication) between proximity connectors 124 on facing surfaces 112 of substrates 110. However, MCM 100 allows substrates 110 to be mechanically coupled to each other and/or a carrier in a single assembly operation, which may facilitate fast, high-yield manufacturing without the use of expensive alignment and assembly equipment.

In particular, negative features 120 that are recessed below surfaces 112, and which have edges that define openings (such as etch pits), may be defined on surfaces 112. These negative features may be loaded with positive features 114 that protrude above surfaces 112 (such as micro-spheres or balls, and, more generally, spherical or hemispherical shapes), and which each have a coating (such as coating 116-1) with a reflow characteristic around a core (such as core 118-1). For example, coatings 116 may include a solder material, such as: a tin-lead alloy (with a 63%/37% or 5%/95% composition), a tin-gold-copper alloy, or a tin-indium alloy. These coatings may have a thickness of 1-10 μm or up to 10% of the diameter of positive features 114. Furthermore, cores 118 may include a non-conducting material (such as a plastic, a polymer, polystyrene, divinylbenzene-copolymer, glass, ruby, sapphire, a ceramic, etc.) or a conducting material (such as stainless steel, a metal, copper, nickel, etc.).

Separately or additionally, negative features 120 on either or both surfaces 112 may include a wettable material 122 that corresponds to coatings 116 on positive features 114, and which may (or may not) also have the reflow characteristic. In general, the reflow characteristic may be associated with either or both of positive features 114 and negative features 120. (Note that each pair of negative features, in conjunction with the associated positive feature, may constitute a coupling element in coupling elements 126 in MCM 100.) For example, wettable material 122 may include: a nickel-gold alloy, a chromium-copper-nickel-gold alloy, etc.

Figure 2:
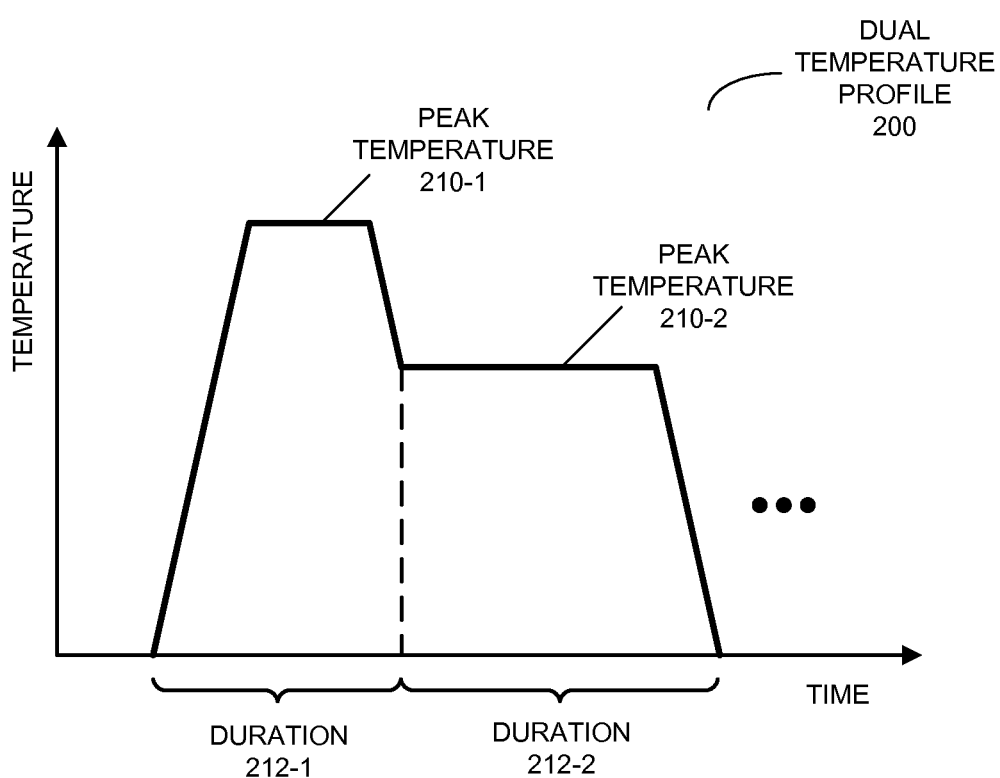
FIG. 2 is a drawing illustrating a dual temperature profile associated with reflow characteristics of sets of coupling elements in the MCM of FIG. 1A or 1B in accordance with an embodiment of the present disclosure.

As described further below with reference to FIG. 2, at least a portion of coatings 116 and/or wettable material 122 may be melted or reflowed by exposing MCM 100 to a temperature profile associated with the reflow characteristic. In this way, substrates 110 may be bonded to each other. Simultaneously, mating positive features 114 and negative features 120 provides highly accurate self-alignment of proximity connectors 124 in an XY plane of substrates 110 (i.e., in the plane of surfaces 112), as well as co-planarity control, during the bonding. For example, the alignment over surfaces 112 may be within ±1 μm in the XY plane. Furthermore, reflowing at least the portion of coatings 116 and/or wettable material 122 may also achieve alignment in the Z direction (i.e., out of the plane of the chip surfaces), thereby reducing the total bondline height in MCM 100 or bounding spacing 128, and facilitating proximity communication between proximity connectors 124.

Figure 1B:
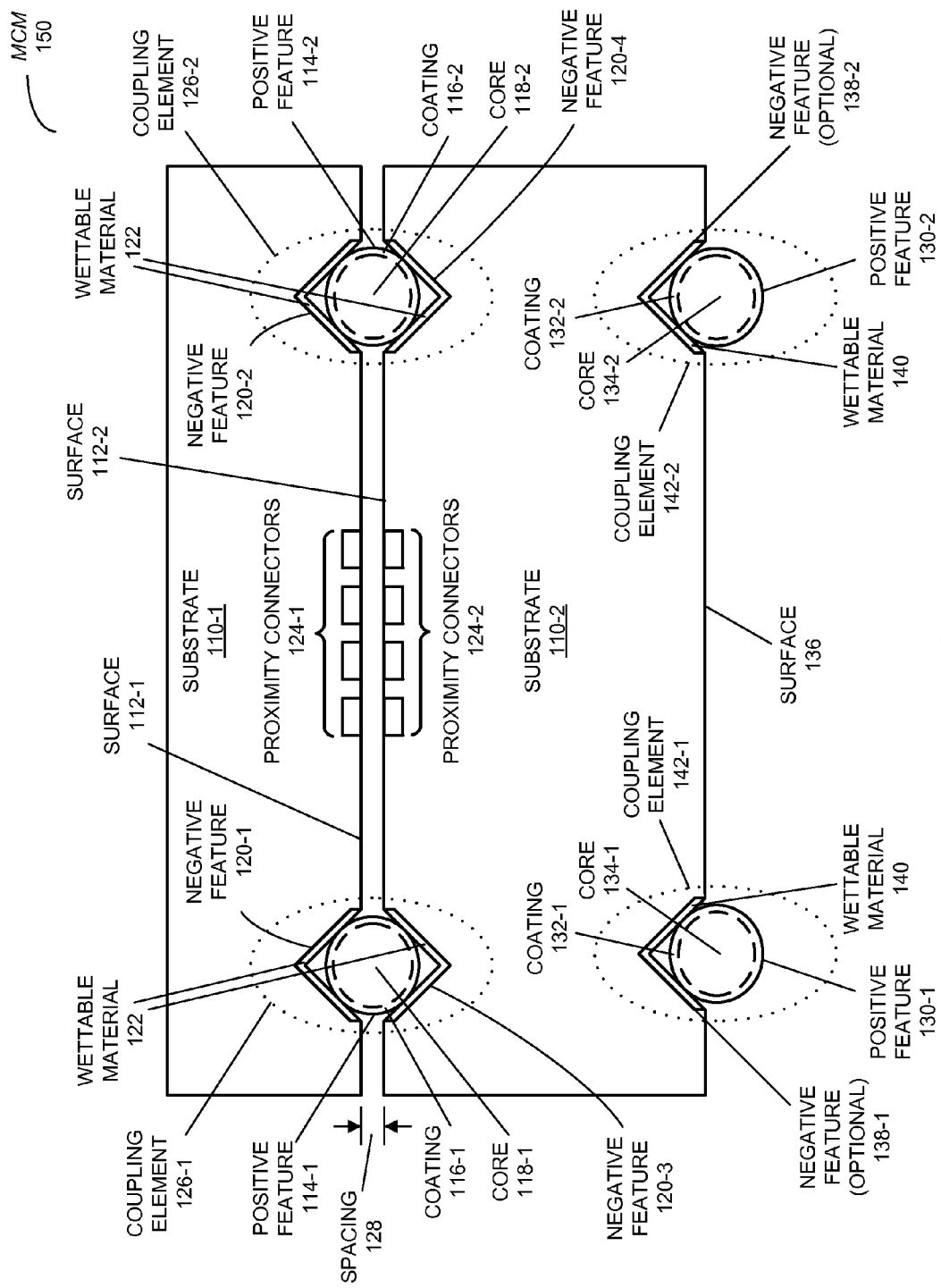
FIG. 1B is a block diagram illustrating an MCM in accordance with an embodiment of the present disclosure.

In addition, substrate 110-1 may have positive features 130, as well as optional negative features 138, disposed on surface 112-1. (Alternatively, as shown in FIG. 1B, which presents a block diagram illustrating an MCM 150, positive features 130, as well as optional negative features 138, may be disposed on surface 136, which is coupled to surface 112-1 by through-silicon vias that are not shown in FIG. 1B.) Referring back to FIG. 1A, positive features 130 may protrude above surface 112-1, and optional negative features 138 may be recessed below surface 112-1, and may have edges that define openings. (Note that each one of positive features 130, optionally in conjunction with one of negative features 138, may constitute a coupling element in coupling elements 142 in MCM 100.) Positive features 130 (such as balls) and/or optional negative features 138 (such as etch pits) may have another reflow characteristic, which is different than the reflow characteristic of coupling elements 126. For example, positive features 130 may each have one of coatings 132 (such as a solder material) with the reflow characteristic around one of cores 134 (such as conducting material or a non-conducting material). Similarly, optional negative features 138 may be coated with a wettable material 140 (such as a nickel-gold alloy, a chromium-copper-nickel-gold alloy, etc.) that corresponds to coatings 132 on positive features 130, and which may (or may not) also have the other reflow characteristic. In general, the reflow characteristic may be associated with either or both of positive features 130 and optional negative features 138.

Coupling elements 142 may mechanically couple substrate 110-1 to another component (not shown) in MCM 100, such as a carrier or a printed circuit board. For example, substrate 110-1 may be bonded to the other component in MCM 100 by melting or reflowing coatings 132 and/or wettable material 140 by exposing MCM 100 to a temperature profile associated with the other reflow characteristic.

As described further below, because the reflow characteristic and the other reflow characteristic are different, MCM 100 provides additional degrees of freedom during assembly. For example, substrates 110 may be aligned and bonded to each other before or after substrate 110-1 is bonded to the other component (thus, there may be different temperature profiles associated with substrate-to-substrate bonding, substrate-to-carrier bonding and/or connector-to-MCM bonding). This capability may facilitate: improved alignment, increased yield, faster manufacturing throughput, lower-cost assembly, etc. For example, as described below with reference to FIG. 2, components in MCM 100 may be bonded to each other using a single reflow process that includes two or more temperature profiles that are respectively associated with the reflow characteristic and the other reflow characteristic. In addition, as described further below with reference to FIGS. 7A and 7B, it may allow temperature-sensitive materials to be included in a manufacturing process that involves high-temperature processing. In some embodiments, the different reflow characteristics facilitate selective disassembly of components in MCM 100 and/or 150 (FIG. 1B), such as during rework.

In an exemplary embodiment, the temperature profiles associated with the reflow characteristic and the other reflow characteristic each include a corresponding peak temperature and duration. This is shown in FIG. 2, which presents a drawing illustrating a dual temperature profile 200 associated with reflow characteristics of sets of coupling elements in MCM 100 (FIG. 1A) or 150 (FIG. 1B). In general, the difference(s) in the temperature profiles associated with the reflow characteristic and the other reflow characteristic can include: different peak temperatures 210, different durations 212, or both. (Alternatively, the peak temperatures and/or the durations may be the same.) For example, if coatings 116 or 132 (FIGS. 1A and 1B) include a tin-based alloy, the peak temperature may be 260-270 C. and the duration may be 1-2 minutes; if coatings 116 or 132 (FIGS. 1A and 1B) include a lead-based alloy, the peak temperature may be 200 C; and if coatings 116 or 132 (FIGS. 1A and 1B) include an indium-based alloy, the peak temperature may be 120 C. Note that, while FIG. 2 illustrates two temperature profiles in a single reflow process, in other embodiments there may be additional temperature profiles, and the order of the temperature profiles in the reflow process may be rearranged as needed.

We now describe a process for assembling an MCM. FIG. 3 presents a flow chart illustrating a process 300 for assembling MCM 100 (FIG. 1A) or 150 (FIG. 1B). During this method, a first surface of a first substrate in the MCM is mechanically coupled to another component by reflowing a set of first coupling elements disposed on the first surface based on a first reflow characteristic of the first coupling elements (operation 310). Then, one of the first surface and the second surface of the first substrate is mechanically coupled to a third surface of a second substrate in the MCM by reflowing a set of second coupling elements in the MCM based on a second reflow characteristic of a set of second coupling elements (operation 312), where the first reflow characteristic is different than the second reflow characteristic.

As noted previously, this assembly technique allows substrates (or chips) to be aligned and bonded to each other using temperature profile $T_0$. Moreover, one or more of the substrates can be bonded to a carrier using temperature profile $T_1$ (such as a temperature profile associated with C4-solder balls). Furthermore, temperature-sensitive components, such as an interconnect cable or connector, can be bonded to one or more of the substrates using temperature profile $T_2$. In addition, temperature profile $T_3$ can be used during post processing to adjust spacing 128 (FIGS. 1A and 1B), for example, by partially melting a positive feature that has an angularly dependent reflow characteristic (as described below with reference to FIG. 4).

Furthermore, as noted previously the order of these temperature profiles can be changed, as needed, based on the components included in an MCM, the desired alignment accuracy, etc. For example, substrates may be aligned and bonded to each other using temperature profile $T_0$; then, one or more of the substrates may be bonded to a carrier using temperature profile $T_1$. In particular, referring to FIG. 1A, substrate 110-1 may be positioned on a carrier. Then, positive features 114 may be placed into negative features 120 on substrate 110-1. Next, substrate 110-2 may be aligned relative to substrate 110-1 using positive features 114 as alignment guides. Furthermore, dual temperature profile 200 (FIG. 2) may be used to melt coatings 116 and 132 at peak temperature 210-1 (FIG. 2), which then wet to their respective pads. As the temperature is reduced, coatings 116 solidify first (thereby bonding substrates 110 to each other, and maintaining the alignment), and then coatings 132 solidify to bond substrate 110-1 to the carrier. Thus, this ordering of the temperature profiles may provide highly accurate alignment between proximity connectors 124, at the cost of a more complicated assembly process.

Alternatively, one or more of substrates 110 may be bonded to the carrier using temperature profile $T_1$, and then the substrates may be aligned and bonded to each other using temperature profile $T_0$ (or coatings 116 and 132 may have the same reflow characteristic). This latter order of the temperature profiles may make it easier to preassemble the components in the MCM, at the cost of larger misalignments between proximity connectors 124.

Note that, regardless of the order of the temperature profiles, process 300 in FIG. 3 allows the components in the MCM to be aligned and assembled concurrently, e.g., without a separate alignment operation and a separate bonding operation. Thus, this process may eliminate the needed for expensive pick-and-place alignment equipment during assembly of the MCM.

This process is also amenable to batch processing, in which the balls are loaded into etch pits while the substrates (or chips) are in wafer form. After placement, the wafer may be passed through a reflow process, which locks the balls into place and eliminates any concerns that they may fall out during subsequent handling. Alternatively or additionally, wafer-level microfabrication techniques can be used to build up solder by plating or evaporation inside the etch pits, and this built-up material can then be reflowed to form the balls inside the pits.

Process 300 may include additional or fewer operations. Moreover, the order of the operations may be changed, and/or two or more operations may be combined into a single operation.

Figure 4:
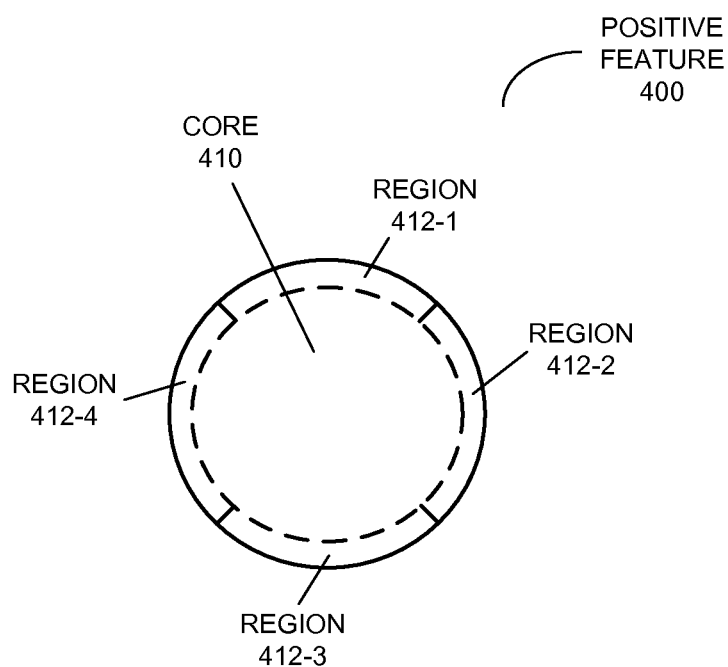
FIG. 4 is a block diagram illustrating a positive feature having a reflow characteristic that varies as a function of angular position in accordance with an embodiment of the present disclosure.

While the preceding discussion illustrated isotropic coatings on the positive features and/or isotropic material in the negative features in the MCM, in other embodiments at least some of the coatings and/or materials may be anisotropic. For example, there may be an angular dependence of the reflow characteristic on the surface of the positive features. This is shown in FIG. 4, which presents a block diagram illustrating a positive feature 400 having a reflow characteristic that varies as a function of angular position. In particular, around core 410 there may be different angular regions 412, at least some of which may have different reflow characteristics. This angular dependency may allow spacing 128 (FIGS. 1A and 1B) to be modified. It may also allow one side of a positive feature to be reflowed, thereby allowing the alignment in the XY plane to be modified.

Note that solder-coated balls (as opposed to solid metal or inorganic balls) may also provide some amount of compliance, which may also allow spacing 128 (FIGS. 1A and 1B) to be modified. For example, if a thermal mismatch between substrates 110 (FIGS. 1A and 1B) results in significant relative lateral motion, solid balls may be more likely to fracture substrates 110. However, a solder coating may be able to deform and absorb this stress, thereby preventing damage to substrates 110.

Figure 5:
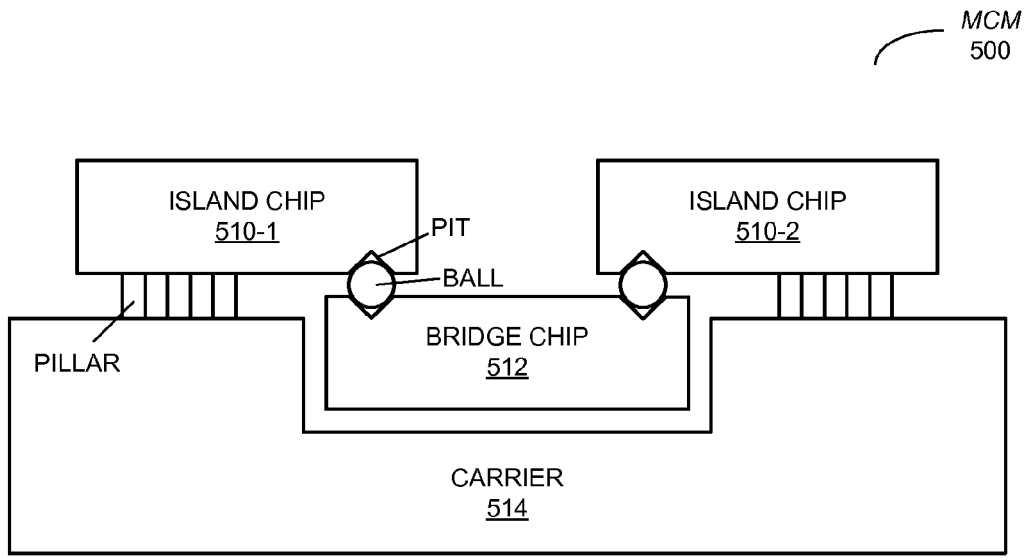
FIG. 5 is a block diagram illustrating an MCM in accordance with an embodiment of the present disclosure.

This assembly technique can be used in a variety of configurations and architectures to accurately align and bond chips together using a reflow process. One configuration is shown in FIG. 5, which presents a block diagram illustrating an MCM 500. In this MCM, face-down island chips 510 (such as processors) are mechanically coupled to a face-up bridge chip 512, and communicate signals with each other using proximity communication. In addition, island chips 510 are mechanically coupled to carrier 514 by level-one interconnects, such as solder-bump (C4) interconnects or copper pillars with solder-coated tips. These level-one interconnects may convey signals, power and ground to island chips 510 from carrier 514.

Figure 6:
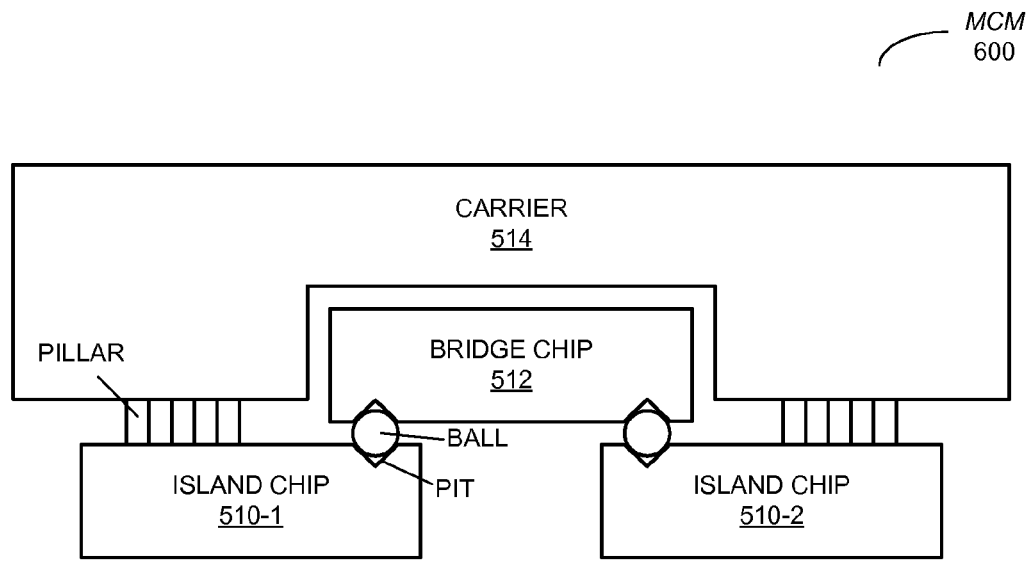
FIG. 6 is a block diagram illustrating an MCM in accordance with an embodiment of the present disclosure.

An illustration of a flip-chip configuration is shown in FIG. 6, which presents a block diagram of MCM 600. In this configuration, island chips 510 are face up and bridge chip 512 is face down.

Figure 7A:
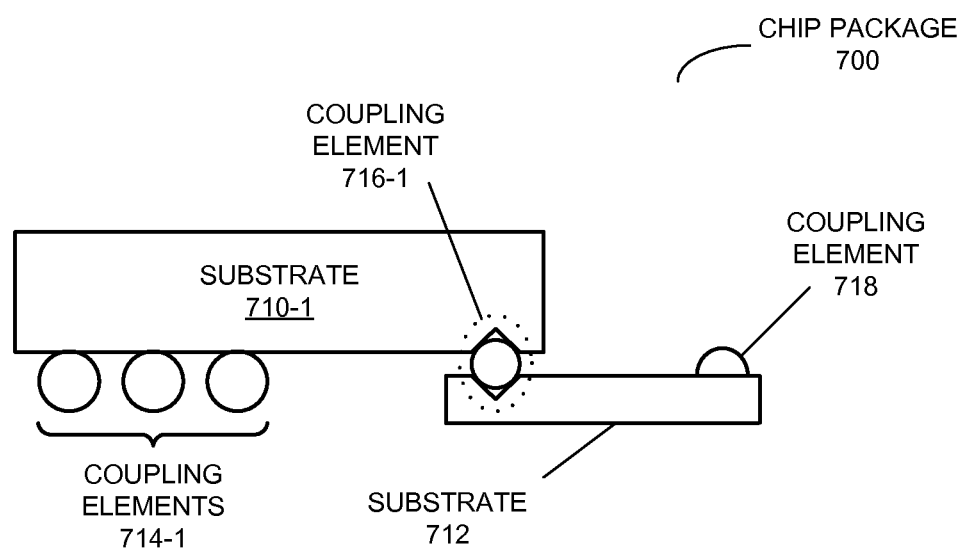
FIG. 7A is a block diagram illustrating a chip package in accordance with an embodiment of the present disclosure.

However, the assembly technique can be used in applications other than MCMs that include island and bridge chips. For example, as shown in FIG. 7A, which presents a block diagram illustrating a chip package 700, a substrate 710-1 (such as a processor) may include coupling elements 714-1 (such as C4 balls) on a surface. These coupling elements may allow substrate 710 to be mechanically coupled to another component in chip package 700, such as a carrier (not shown). Furthermore, coupling elements 714-1 may have a first reflow characteristic, such as a temperature profile that may be used to reflow coupling elements 714-1. In addition, one or more other coupling elements, such as coupling element 716-1 (or a ball-in-pit coupling element), which have a second reflow characteristic, may mechanically couple substrate 710-1 to substrate 712. In turn, substrate 712 may include or be attached to one or more coupling elements, such as coupling element 718, which has a third reflow characteristic. This coupling element may be used to mechanically couple substrate 712 to an additional component (not shown) in chip package 700 (such as a flexible connector).

Note that the first reflow characteristic, the second reflow characteristic and/or the third reflow characteristic may be different. This may allow substrate 712 to be mechanically coupled to substrate 710-1 at a different peak temperature than that used to mechanically couple substrate 710-1 to the carrier (such as an organic or ceramic substrate, or a silicon interposer). This can be useful because substrate 712 may be incompatible with a peak temperature in the temperature profile associated with the reflow characteristic of coupling elements 714-1. For example, interconnects or cables may deteriorate if the temperature during the reflow process is higher than 110-125 C. Consequently, coupling elements 714-1 may be reflowed first before substrate 710-1 is bonded to substrate 712. In particular, chip package 700 may be exposed to a first temperature profile to reflow coupling elements 714-1, and then may be exposed to a second temperature profile (with a lower peak temperature and/or a shorter duration) to reflow and bond chip package 700 to substrate 712. (More generally, this approach may be used to bond a connector to an MCM.) Thus, the different reflow characteristics may facilitate assembly of chip package 700.

As shown in FIG. 7B, which presents a block diagram illustrating a chip package 750, carrier 760 (such as an organic or ceramic substrate) may be mechanically coupled to substrates 710 using coupling elements 714, and may be mechanically coupled to additional component(s) (not shown) in chip package 750 using coupling elements 762 (such as BGAs). Note that coupling elements 762 may have a fourth reflow characteristic, which may be different than one or more of the other reflow characteristics of other coupling elements in chip package 750. In addition, in chip package 750, coupling element 718 may be used to couple one or more other components (not shown) directly to carrier 760 (as opposed to substrate 712 in chip package 750).

Figure 8:
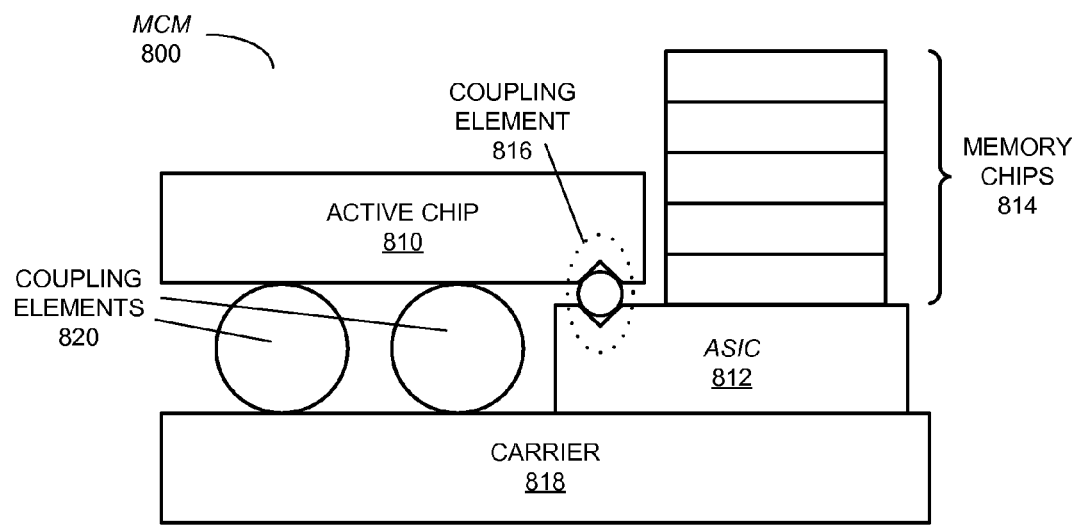
FIG. 8 is a block diagram illustrating an MCM in accordance with an embodiment of the present disclosure.

Another configuration is shown in FIG. 8, which presents a block diagram illustrating an MCM 800. In this example, proximity communication is used between a high pin-count active chip 810 and a controller application-specific integrated circuit (ASIC) 812 to communicate with stacked memory chips 814. Coupling element 816, which includes etch pits and a solder-coated sphere having the reflow characteristic, establishes direct contact and accurate alignment in a diving-board configuration. In addition, chip 810 is mechanically coupled to carrier 818 by coupling elements 820, which have the other reflow characteristic. These components in this MCM could be bonded using a single reflow process to obtain high-compliance, self-assembled solder interconnects.

Figure 9:
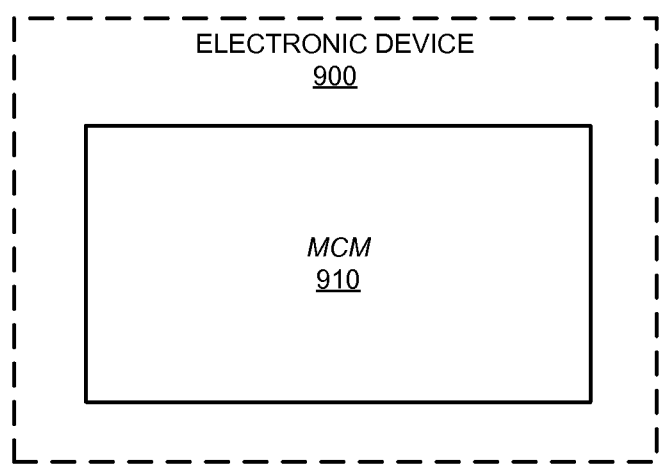
FIG. 9 is a block diagram illustrating an electronic device in accordance with an embodiment of the present disclosure.

Embodiments of the MCM and the assembly technique may be used in a wide variety of applications, such as: a die stack in a memory application, flip-chip bonding and/or multi-layer stacks. A general application of an MCM is shown in FIG. 9, which presents a block diagram illustrating an electronic device 900. This electronic device includes MCM 910, which may include one or more of the MCMs in the preceding embodiments.

In general, an MCM may include an array of chip modules (CMs) or single-chip modules (SCMs), and a given SCM may include at least one substrate, such as a semiconductor die. Furthermore, the substrate may communicate with other substrates, CMs, SCMs, and/or optical devices in the MCM using proximity communication of electromagnetically coupled signals (which is referred to as 'electromagnetic proximity communication'). For example, the proximity communication may include: communication of capacitively coupled signals ('electrical proximity communication') and/or communication of optical signals ('optical proximity communication'). In some embodiments, the electromagnetic proximity communication includes inductively coupled signals and/or conductively coupled signals.

Furthermore, embodiments of the MCM may be used in a variety of applications, including: VLSI circuits, communication systems (such as in wavelength division multiplexing), storage area networks, data centers, networks (such as local area networks), and/or computer systems (such as multiple processor-core computer systems). For example, an MCM may be included in a backplane that is coupled to multiple processor blades, or an MCM may couple different types of components (such as processors, memory, I/O devices, and/or peripheral devices). In some embodiments, an MCM performs the functions of: a switch, a hub, a bridge, and/or a router.

Note that electronic device 900 may include, but is not limited to: a server, a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer or computer system may be at one location or may be distributed over multiple, geographically dispersed locations.

The MCMs in the preceding embodiments and/or electronic device 900 may include fewer components or additional components. For example, there may be more than two substrates or components in an MCM (such as N components), and the assembly technique (which may include M temperature profiles, where M may be the same or different from N) may allow precise alignment of proximity connectors in multiple regions on these substrates or components. Moreover, substrates 110 (FIGS. 1A and 1B) may include silicon-on-insulator technology. Note that surfaces 112 and 136 should be understood to include surfaces of substrates 110 or surfaces of layers deposited on substrates 110 (such as a dielectric layer deposited on a substrate). Furthermore, positive features (such as positive features 114) may have other shapes than spherical or hemispherical, such as protrusions that resemble a top hat or a pyramidal structure. Additionally, in some embodiments of MCMs 500 (FIG. 5) and 600 (FIG. 6) bridge chip 512 is not recessed, i.e., carrier 514 in FIGS. 5 and 6 may not include a cavity.

While the coupling elements in the preceding MCMs were used to align and mechanically couple components, in other embodiments the coupling elements may also provide electrical coupling. For example, coupling elements 126 and/or 142 (FIGS. 1A and 1B) may provide power and ground to either or both of substrates 110 (FIGS. 1A and 1B).

Furthermore, although the MCMs in the preceding discussion are illustrated as having a number of discrete items, these MCMs are intended to be functional descriptions of the various features that may be present rather than structural schematics of the embodiments described herein. Consequently, in these embodiments two or more components may be combined into a single component, and/or a position of one or more components may be changed.

Additionally, note that components in the MCMs may be fabricated, and the MCMs may be assembled, using a wide variety of techniques, as is known to one of skill in the art.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A multi-chip module (MCM), comprising:
a first substrate having a first surface and a second surface on an opposite side of the first substrate from the first surface, wherein a set of first coupling elements are disposed on the first surface, wherein each first coupling element comprises a layer with a first reflow characteristic, and wherein the set of first coupling elements are configured to mechanically couple the first substrate to another component; and
a second substrate having a third surface that is mechanically coupled to one of the first surface and the second surface by a set of second coupling elements, wherein each second coupling element comprises a layer with a second reflow characteristic, and wherein the first reflow characteristic is different than the second reflow characteristic,
wherein each coupling element in the set of first coupling elements comprises a positive feature and a negative feature, wherein the negative feature of the coupling element in the set of first coupling elements defines an opening on the first surface of the first substrate and wherein the positive feature of the coupling element in the set of first coupling elements is coupled to the negative feature inside the opening and protrudes from the first surface, wherein a set of first proximity connectors are disposed on one of the first surface and the second surface, wherein a set of second proximity connectors are disposed on the third surface, and wherein the set of second coupling elements align the first proximity connectors and the second proximity connectors, and assemble the MCM, thereby facilitating proximity communication between the first substrate and the second substrate.

2. The MCM of claim 1, wherein the first reflow characteristic is associated with a first temperature profile with a first peak temperature and a first duration that is used when reflowing at least a portion of the set of first coupling elements;

wherein the second reflow characteristic is associated with a second temperature profile with a second peak temperature and a second duration that is used when reflowing at least a portion of the set of second coupling elements; and wherein at least one of the first peak temperature is different from the second peak temperature and the first duration is different from the second duration.

3. The MCM of claim 1, wherein the set of first coupling elements includes a set of first positive features that protrudes above the first surface;

wherein the set of second coupling elements includes a set of second positive features that protrudes above the third surface, and one of the first surface and the second surface; and wherein a given positive feature in one of the set of first positive features and the set of second positive features includes a spherically shaped coupling component.

4. The MCM of claim 3, wherein the first reflow characteristic is associated with the set of first positive features, and the second reflow characteristic is associated with the set of second positive features.

5. The MCM of claim 3, wherein the set of second coupling elements includes a set of first negative features that are recessed below one of the first surface and the second surface, and includes a set of second negative features that are recessed below the third surface; and wherein a given second positive feature in the set of second positive features is, respectively, mechanically coupled to a pair of negative features that includes one of the first negative features and one of the second negative features.

6. The MCM of claim 5, wherein the second reflow characteristic is associated with the set of first negative features and the set of second negative features.

7. The MCM of claim 5, wherein the second reflow characteristic is associated with the set of second positive features, the set of first negative features and the set of second negative features.

8. The MCM of claim 5, wherein a given negative feature in the set of first negative features and the set of second negative features includes an etch pit.

9. The MCM of claim 3, wherein the set of first coupling elements includes a set of first negative features that are recessed below the first surface and that are mechanically coupled to corresponding first positive features.

10. The MCM of claim 9, wherein the first reflow characteristic is associated with the set of first negative features.

11. The MCM of claim 9, wherein the first reflow characteristic is associated with the set of first positive features and the set of first negative features.

12. The MCM of claim 1, wherein one of the set of first coupling elements and the set of second coupling elements is configured to provide electrical coupling.

13. A method for assembling multi-chip module (MCM), comprising:

mechanically coupling a first surface of a first substrate in the MCM to another component by reflowing a set of first coupling elements disposed on the first surface based on a first reflow characteristic of the first coupling elements, wherein each first coupling element comprises a layer with the first reflow characteristic; and mechanically coupling one of the first surface and a second surface of the first substrate to a third surface of a second substrate in the MCM by reflowing a set of second coupling elements in the MCM based on a second reflow characteristic of the set of second coupling elements, wherein each second coupling element comprises a layer with the second reflow characteristic, and wherein the first reflow characteristic is different than the second reflow characteristic, wherein each coupling element in the set of first coupling elements comprises a positive feature and a negative feature, wherein the negative feature of the coupling element in the set of first coupling elements defines an opening on the first surface of the first substrate and wherein the positive feature of the coupling element in the set of first coupling elements is coupled to the negative feature inside the opening and protrudes from the first surface, wherein a set of first proximity connectors are disposed on one of the first surface and the second surface, wherein a set of second proximity connectors are disposed on the third surface, and wherein the set of second coupling elements align the first proximity connectors and the second proximity connectors, and assemble the MCM, thereby facilitating proximity communication between the first substrate and the second substrate.

* * * * *